US012793802B2

(12) United States Patent
Horch

(10) Patent No.: US 12,793,802 B2
(45) Date of Patent: Nov. 10, 2026

(54) ONE-TIME PROGRAMMABLE BITCELL FOR FRONTSIDE AND BACKSIDE POWER INTERCONNECT

(71) Applicant: Synopsys, Inc., Sunnyvale, CA (US)

(72) Inventor: Andrew Edward Horch, Seattle, WA (US)

(73) Assignee: SYNOPSYS, INC., Sunnyvale, CA (US)

( * ) Notice: Subject to any disclaimer, the term of this patent is extended or adjusted under 35 U.S.C. 154(b) by 117 days.

(21) Appl. No.: 18/991,201

(22) Filed: Dec. 20, 2024

(65) Prior Publication Data

US 2025/0124992 A1 Apr. 17, 2025

Related U.S. Application Data

(62) Division of application No. 18/071,321, filed on Nov. 29, 2022, now Pat. No. 12,217,809.

(60) Provisional application No. 63/290,022, filed on Dec. 15, 2021.

(51) Int. Cl.
*G11C 16/04* (2006.01)
*G11C 17/16* (2006.01)
*G11C 17/18* (2006.01)

(52) U.S. Cl.
CPC .............. *G11C 17/16* (2013.01); *G11C 17/18* (2013.01)

(58) Field of Classification Search
CPC ................................ G11C 17/16; G11C 17/18
See application file for complete search history.

(56) References Cited

U.S. PATENT DOCUMENTS

| | | | | |
|---|---|---|---|---|
| 12,217,809 | B2 * | 2/2025 | Horch | G11C 17/16 |
| 2003/0201819 | A1 | 10/2003 | Zheng | |
| 2012/0039105 | A1 | 2/2012 | Toriege | |
| 2016/0314831 | A1 | 10/2016 | Liaw | |
| 2021/0257007 | A1 * | 8/2021 | Kota | G11C 7/1087 |
| 2022/0215891 | A1 * | 7/2022 | Li | G11C 17/04 |
| 2023/0043443 | A1 | 2/2023 | Chang | |
| 2023/0197162 | A1 * | 6/2023 | Saxena | G11C 16/08 365/189.011 |

* cited by examiner

*Primary Examiner* — Pho M Luu

(74) *Attorney, Agent, or Firm* — Womble Bond Dickinson (US) LLP

(57) ABSTRACT

A bitcell of a one-time programmable memory includes: a write-once programmable circuit element and a node connected in series between a word line and a power rail; a select read device connected between the node and a bitline, the select read device having a gate electrode connected to a first signal line extending parallel to the word line; and a select write device connected between the word line and the power rail and in series with the write-once programmable circuit element and the node, the select write device having a gate electrode connected to a second signal line extending parallel to the bitline.

20 Claims, 10 Drawing Sheets

ONE-TIME PROGRAMMABLE BITCELL FOR FRONTSIDE AND BACKSIDE POWER INTERCONNECT

RELATED APPLICATION

This application is a Divisional of U.S. patent application Ser. No. 18/071,321, filed Nov. 29, 2022, and issued as U.S. Pat. No. 12,217,809 on Feb. 4, 2025 which claims the benefit of U.S. Provisional Patent Application No. 63/290,022 filed in the United States Patent and Trademark Office on Dec. 15, 2021, the entire disclosure of each of which is incorporated by reference herein.

TECHNICAL FIELD

The present disclosure generally relates to an integrated circuit (IC). In particular, the present disclosure relates to a one-time programmable bitcell suitable for use with frontside and backside power interconnect.

BACKGROUND

In semiconductor manufacturing processes, a back end of line (BEOL) stage of an IC fabrication process adds metal interconnects on top of individual devices, such as transistors, capacitors, and resistors, where the individual devices were previously formed in a front end of line (FEOL) stage of the IC fabrication process. The metal interconnects are used to provide wiring between the individual devices, including supplying high frequency signals between the devices and supplying power to the devices. This results in high congestion of both signals and power lines in the lower metal levels. This also causes the metal stack to be a compromise between high power (e.g., high current, as implemented by a low resistance metal connection) and high speed (e.g., high frequency, as implemented by a low capacitance metal connection).

One-time programmable (OTP) memory is a type of non-volatile memory that can be written to only once. OTP memory is used in applications such as microprocessors, sensors, and display (e.g., for storing configuration or calibration parameters, identifiers, and other permanent information). A one-time programmable memory may include multiple OTP bitcells arranged, for example, in a linear array or in the rows and columns of a two-dimensional matrix or two-dimensional array.

SUMMARY

According to one embodiment of the present disclosure, a bitcell of a one-time programmable memory includes: a write-once programmable circuit element and a node connected in series between a word line and a power rail; a select read device connected between the node and a bitline, the select read device having a gate electrode connected to a first signal line extending substantially parallel to the word line; and a select write device connected between the word line and the power rail and in series with the write-once programmable circuit element and the node, the select write device having a gate electrode connected to a second signal line extending substantially parallel to the bitline.

The write-once programmable circuit element may be a positive metal oxide semiconductor (PMOS) anti-fuse.

The select write device may include a cascode negative metal oxide semiconductor (NMOS) device. The cascode NMOS device may include: a first NMOS transistor having the gate electrode connected to the second signal line; and a second NMOS transistor connected in series with the first NMOS transistor and having a gate electrode connected to a third signal line extending substantially perpendicular to the second signal line.

The select read device may include a cascode NMOS device including: a first NMOS transistor having the gate electrode connected to the first signal line; and a second NMOS transistor connected in series with the first NMOS transistor and having a gate electrode connected to a third signal line extending substantially parallel to the first signal line.

The bitline may have a lower capacitance than the word line, and the word line may have lower resistance than the bitline.

The one-time programmable memory may further include a second one-time programmable bitcell including: a second write-once programmable circuit element and a second node connected in series between the word line and the power rail; a second select read device connected between the second node and a second bitline extending parallel to the bitline, the second select read device having a gate electrode connected to the first signal line; and a second select write device connected between the word line and the second node and in series with the second write-once programmable circuit element and the second node, the second select write device having a gate electrode connected to a third signal line extending substantially parallel to the bitline.

The select write device may include a cascode NMOS device including: a first NMOS transistor having the gate electrode connected to the second signal line; and a second NMOS transistor connected in series with the first NMOS transistor and having a gate electrode connected to a fourth signal line extending substantially perpendicular to the second signal line, and the second select write device may include a cascode NMOS device including: a first NMOS transistor having the gate electrode connected to the third signal line; and a second NMOS transistor connected in series with the first NMOS transistor and having a gate electrode connected to the fourth signal line.

According to one embodiment of the present disclosure, a bitcell of a one-time programmable memory includes: a select read device connected between a node and a first bitline, the select read device having a gate electrode connected to a first signal line extending substantially perpendicular to the first bitline; a first select write device connected between a supply power rail and a power rail and in series with the node, the first select write device having a gate electrode connected to a second signal line extending substantially parallel to the first bitline, wherein the supply power rail has higher voltage than the power rail; a second select write device connected between the node and the power rail and in series with the first select write device and the node, the second select write device having a gate electrode connected to a third signal line extending substantially perpendicular to the first bitline; and a write-once programmable circuit element connected between the node and the power rail and in series with the first select write device, the second select write device, and the node.

The node and the write-once programmable circuit element may be between the first select write device and the second select write device.

The node and first select write device may be between the write-once programmable circuit element and the second select write device.

The select read device may include a PMOS read select device.

The one-time programmable memory may further include a second one-time programmable bitcell including: a second select read device connected between a second node and a second bitline extending substantially parallel to the first bitline, the second select read device having a gate electrode connected to the first signal line; a third select write device connected between the supply power rail and the second node, the third select write device having a gate electrode connected to a third signal line extending substantially parallel to the first bitline; a fourth select write device connected between the second node and the power rail, the fourth select write device having a gate electrode connected to the third signal line; and a second write-once programmable circuit element connected to the node, in series with the third select write device and the fourth select write device, between the supply power rail and the power rail.

According to one embodiment of the present disclosure, a method for writing to a bitcell of a one-time programmable memory including: a write-once programmable circuit element and a middle node connected in series between a word line and a power rail; a select read device connected between the node and a bitline, the select read device having a gate electrode connected to a first signal line extending parallel to the word line, the bitline having lower capacitance than the word line, the word line having lower resistance than the bitline; and a select write device connected between the word line and the power rail and in series with the write-once programmable circuit element and the node, the select write device having a gate electrode connected to a second signal line extending parallel to the bitline, where the method includes: charging the node to an intermediate voltage between a rupture voltage and a ground voltage; applying a first signal to the first signal line to turn off the select read device; applying a second signal to the second signal line to turn on the select write device; and pulsing the power rail to the rupture voltage.

The write-once programmable circuit element of the bitcell may be a PMOS anti-fuse.

The select write device of the bitcell may include a cascode NMOS device including: a first NMOS transistor having the gate electrode connected to the second signal line; and a second NMOS transistor connected in series with the first NMOS transistor and having a gate electrode connected to a third signal line extending perpendicular to the second signal line, and the method may further include: applying a third signal to the third signal line to turn on the second NMOS transistor.

The select read device of the bitcell may include a cascode NMOS device including: a first NMOS transistor having the gate electrode connected to the first signal line; and a second NMOS transistor connected in series with the first NMOS transistor and having a gate electrode connected to a third signal line extending parallel to the first signal line, and the method may further include: applying a third signal to the third signal line to turn on the second NMOS transistor.

The bitcell may be a bitcell of an array of bitcells further including a second one-time programmable bitcell including: a second write-once programmable circuit element and a second node connected in series between the word line and the power rail; a second select read device connected between the second node and a second bitline extending parallel to the bitline, the second select read device having a gate electrode connected to the first signal line; and a second select write device connected between the word line and the second node and in series with the write-once programmable circuit element and the second node, the second select write device having a gate electrode connected to a third signal line extending parallel to the bitline, and the method may further include charging the second node to the intermediate voltage.

The select write device may include a cascode NMOS device including: a first NMOS transistor having the gate electrode connected to the second signal line; and a second NMOS transistor connected in series with the first NMOS transistor and having a gate electrode connected to a fourth signal line extending perpendicular to the second signal line, the second select write device may include a cascode NMOS device including: a first NMOS transistor having the gate electrode connected to the third signal line; and a second NMOS transistor connected in series with the first NMOS transistor and having a gate electrode connected to the fourth signal line, and the method may further include supplying a fourth signal to the fourth signal control line to turn on: the second NMOS transistor of the select write device; and the second NMOS transistor of the second select write device.

The array of bitcells may further include a third one-time programmable bitcell including: a third write-once programmable circuit element and a third node connected in series between the word line and a second power rail extending parallel to the word line; a third select read device connected between the third node and the bitline, the third select read device having a gate electrode connected to a fourth signal line; and a third select write device connected between the word line and the third node and in series with the write-once programmable circuit element and the third node, the third select write device having a gate electrode connected to the second signal line, and the method may further include maintaining the second power rail at a ground voltage during the writing to the bitcell.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1A:
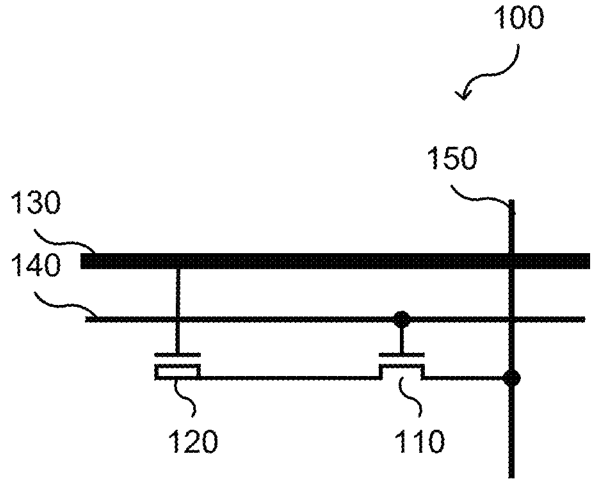
FIG. 1A shows an example 2T OTP (One Time Programable) Bitcell.

Aspects of the present disclosure relate to a one-time programmable bitcell for frontside and backside power interconnect.

In a semiconductor manufacturing process, integrated circuits such as computer chips are fabricated on a flat semiconductor substrate by sequentially depositing layers of material onto the substrate. The substrate is typically a piece of silicon but may sometimes be another material such as gallium arsenide, which can provide different tradeoffs in terms of cost and performance. To add a patterned layer of material onto the substrate, a light-sensitive material is first applied to the substrate, and then a mask is used to selectively expose some parts of that light-sensitive material to light. This light exposure causes some parts of the light-sensitive material to cure and to attach to the surface so that the other parts of the material can be washed away. The desired material can then be applied over the entire surface and then the light-sensitive material, together with the desired material deposited on top, is removed such that desired material is placed only in the specified locations on the substrate. This process is repeated many times to deposit many layers of different materials onto the substrate, such as electrically insulating layers, electrically conductive layers, dopants, and the like. The controlled deposition of materials onto the substrate in specified patterns forms electrical circuit elements, such as transistors, resistors, capacitors, and wires (or metal interconnect) on the substrate, where the transistors are typically formed near the bottom of the stack of layers.

The size and shape of a metal interconnect or metal wire has a significant impact on its electrical properties. Generally, thicker wires (with a larger vertical height) have lower resistance and higher capacitance than thinner wires (with a smaller vertical height). This means that thicker wires are better suited for transmitting high current long distances, such as the case for power supply rails that supply power to different parts of the circuit. On the other hand, the high capacitance of these thicker wires makes them less suitable for transmitting rapidly-changing signals such as data signals across shorter distances (power supply voltages generally do not change much and therefore are tolerant of high capacitance). Conversely, thinner wires, which have higher resistance than thicker wires, are generally less suitable for transmitting power across longer distances, because the high resistance can cause a noticeable drop in voltage along the length of the wire. On the other hand, the lower capacitance of thinner wires makes them better suited to transmitting data signals across shorter distances.

Generally, thinner wires tend to be placed at lower layers of the stack of layers forming the semiconductor device and thicker wires tend to be placed at higher layers (deposited later than the lower layers). Nevertheless, the thicker wires deposited at higher layers also need to connect to the transistors near the bottom of the stack, that means the power supply needs be routed down through the lower levels of metal to connect to devices formed at the wafer surface. This creates congestion at the lower levels and forces the power lines to be partially routed through thin metal lines in the lower layers.

In some semiconductor chip manufacturing processes, all circuit elements of an integrated circuit, including transistors and metal interconnects, are formed on only one side of a flat substrate, where the other side of the substrate is unmodified (e.g., where semiconductor devices are not formed on the opposite side of the silicon substrate).

As semiconductor processes continue to scale, in some designs, metal interconnects are placed both on top of the device, such as transistors (topside interconnect), as well as below the transistors (backside or buried interconnect). Typically, the wafer is made in a similar way as previously, but with metal vias added that extend from the wafer surface down below the transistors. The wafer is flipped upside down, the wafer is thinned to expose the buried vias, and additional metal interconnect is added working from the backside of the wafer. This allows for interconnect to the transistors from both top (or frontside) and bottom (or backside). This also allows for two different metal stacks to be optimized independently for different functionality.

In these semiconductor processes, metal interconnects are placed both on one side (e.g., top) of the device, such as transistors (topside or frontside interconnect), as well as an opposite side (e.g., below) the transistors (backside or buried interconnect). During wafer processing, transistors and other devices are formed on one side of the wafer as discussed above. The wafer is held in place for many manufacturing steps by using a ring around the edge of the top or front of the wafer to press the wafer against a surface of a tool (e.g., a photolithography tool, a chemical vapor deposition tool, an ion implantation tool, an etching tool, etc.). When the wafers are being transferred from one tool to another tool during manufacturing, many tools use suction to "grab" the back of the wafer. (The front of the wafer cannot be touched without risk of damaging the layers formed there.) Layers are built up on one side of the wafer over many steps. The surface where the devices are formed is considered the front or frontside or top of the wafer.

In these semiconductor processes, after one side of the wafer is fully formed, it is covered in a protective layer and then flipped over such that the other side or back side can be processed (e.g., by forming metal interconnects and other devices on the other side of the wafer). The side of the wafer that is processed first and that has the transistors is typically referred to as the front or frontside or top of the wafer. The side of the wafer that is processed second is called the back or backside or bottom or buried side of the wafer. Forming transistors frequently involves higher temperatures than most metal interconnect can tolerate. Therefore, the transistors need to be formed before most metal interconnect is formed. Since metal interconnect is formed on the topside after the transistors are formed, the maximum temperature during the backside processing is limited to what the front side metal interconnect can tolerate. In practice, this often means that only metal interconnect can be added to the backside or buried side because applying high temperatures to form transistors on the backside would damage the previously deposited metal interconnect on the front side.

Because there are two different metal stacks—a topside or frontside stack located on or above of the same side of the substrate as the transistors and a backside stack located on the other side of the substrate (where part of the substrate was removed to provide access to the transistors on the front side)—the metal stacks on the two sides can be optimized for different functions: top side metal layers with thinner metal lines having low capacitance for high speed short distance interconnect; and backside metal layers with thicker metal interconnect having low resistance for high current power supplies, thereby enabling two different metal stacks that can be optimized for different functions providing improved overall performance.

In more detail, the buried (or backside) metal interconnect may be optimized for power supply needs (e.g., low resistance, high immunity to electro migration), noting that power supplies can tolerate higher capacitance than lines carrying high frequency signals. To reduce or minimize the pitch or spacing between the metal lines, the buried power rails may be optimized to run parallel to each other in a particular orientation. This works well for power supplies, which are typically direct current (DC), and which have coupling capacitors added between them to reduce or smooth ripples in the voltage. This approach is suitable for synthesized digital logic and static memory (SRAM) cells that are optimized for a specific pitch in a specific orientation. Changes to use the buried metal lines for short distance signals other can result in a very large area increase, resulting in inefficient use of space in the chip design. Typically, the minimum size of a thick metal line is much larger than a thin metal line, which means that a very large metal island may be needed to act as a jumper between two different backside metal layers (e.g., from backside metal1 to backside metal2). Specifically, if two signals run perpendicular to each other and need to have high density, such as when connecting to a bitcell, then typically one signal needs to be routed from one metal layer to a different metal layer. The small piece of metal needed to connect or pass a signal from one contact (or via) through a metal layer to a via on another level can be very costly in size. This small piece of metal used only to pass through (or jumper or bridge) two backside metal at different levels (or a contact to vias at different levels) can be called a dot or an island.

The topside metal interconnect may be optimized for high frequency signals traveling short distances. For example, the topside metal may be thin to reduce or minimize capacitance, although this will result in higher resistance than the buried metal of the backside interconnect. This increased resistance makes such thinner metal interconnects generally unsuitable for carrying high currents for long distances, such as the case for supplying power to the devices (transistors) in the design. On the other hand, these thinner metal interconnects are suitable for transmitting local signals. For example, if the output of one transistor is going into the gate of another transistor, very little current is needed (only needs to charge or discharge the metal interconnect capacitance and the gate of a transistor). In addition, the small thin metal line is small in size and therefore allows increased density of interconnect.

Therefore, in such an arrangement, the buried/backside metal interconnect is more appropriately used for any signal that needs high current (e.g., a low resistance interconnect to reduce a voltage drop or current-resistance (IR) drop along the interconnect) and that can tolerate high capacitance (e.g., low speed or low frequency signals, such as direct current (DC) signals). In contrast, the front or topside metal interconnect is more appropriately used for high speed or high frequency signals that need low capacitance and can tolerate limited current. In more detail, a metal interconnect may be designed for high current and low resistance by having a larger cross-sectional area (e.g., thicker and/or wider metal interconnects) but this larger cross-sectional area results in higher capacitance than metal interconnects with smaller cross-sectional areas. On the other hand, a metal interconnect may be designed for high speed and low capacitance by having a smaller cross-sectional area (e.g., thinner and/or narrower metal interconnects), but such a metal interconnect has higher resistance than metal interconnects with larger cross-sectional areas.

Accordingly, in these example arrangements, a buried/backside metal interconnect has a larger cross-sectional area than a frontside or topside metal interconnect and therefore the buried/backside metal interconnect has a lower resistance and higher capacitance than the front or topside metal interconnect. Likewise, the frontside or topside metal interconnect has a smaller cross-sectional area than the buried/backside metal interconnect and therefore has a higher resistance and lower capacitance than the buried/backside metal interconnect.

In some semiconductor manufacturing processes, most features are defined using the diffraction of light. Diffraction allows for features to be formed that are smaller than the wavelength of the light used to make them. This allows the buried metal lines to be pitch matched to the transistors, but with many limitations. Diffraction is very effective at making long straight lines, but it can be difficult to control diffraction effects to define dots or islands.

Generally, a one-time programmable (OTP) bitcell is programmed by applying a high voltage to rupture an anti-fuse, followed by a high current to form a conductive filament in the anti-fuse or a high current to break a connection in a fuse. The term write-once programmable circuit element will be used herein to refer to fuses and anti-fuses. The value stored in an OTP bitcell therefore depends on whether that write-once programmable circuit element (a fuse or anti-fuse) has been permanently altered—the OTP bitcell stores a default value (e.g., 0) if unaltered and stores a different value (e.g., 1) once the fuse or anti-fuse has been modified. In a comparative OTP array, OTP bitcells may be arranged in a row/column architecture (e.g., a two-dimensional matrix), where an individual bitcell is programmed (e.g., modified from the default value) by supplying high current flowing both vertically along a column line and horizontally along a row line to the particular bitcell being ruptured at a crossing region of the column line and row line. However, applying high current along both a column direction and a row direction may be challenging in arrangement where the low resistance (high current) metal interconnects (e.g., buried power rails) run parallel to one another (e.g., all along a column direction or all along a row direction) and there is a large area increase if an island is added to jump the signal from a first thick metal line to a second thick metal line running perpendicular to the first think metal line.

FIG. 1A shows an example 2T (two transistor) one time programmable (OTP) bitcell 100. The bitcell 100 uses two NMOS devices: one as a select device 110; and another as an anti-fuse device 120 (e.g., such that the anti-fuse, by default, provides a high resistance connection or effective open circuit, but ruptures when high voltage is applied to the anti-fuse, thereby breaking down the insulation and with high current forming a permanent connection through the anti-fuse). The bitcell 100 is programmed by rupturing that gate of the anti-fuse device 120. This rupturing is done by bringing the word line (WL) 130 up to a voltage capable of rupturing that gate of the anti-fuse device 120 (e.g., a rupture voltage) for a specified write time and bringing that gate of the select device 110 high (by applying a turn-on voltage to select line 140) to turn the select device on and holding the bitline (BL) 150 at 0V. When the gate of the anti-fuse ruptures the bitcell must provide a low resistance (high current) path from the word line WL 130 to the bitline BL 150 allowing sufficient current to flow to allow a low resistance filament to form. The bitcell may be one bitcell in an array of bitcells, where all of the bitcells in a same row are connected to the same word line WL and all of the bitcells in a same column are connected to the same bitline BL. As such, an individual bitcell can be selected for rupturing by applying the rupture voltage to the word line WL 130 connected to that bitcell, applying an appropriate voltage to the select line 140, and holding the bitline BL 150 connected to that same bitcell at 0V.

Figure 1B:
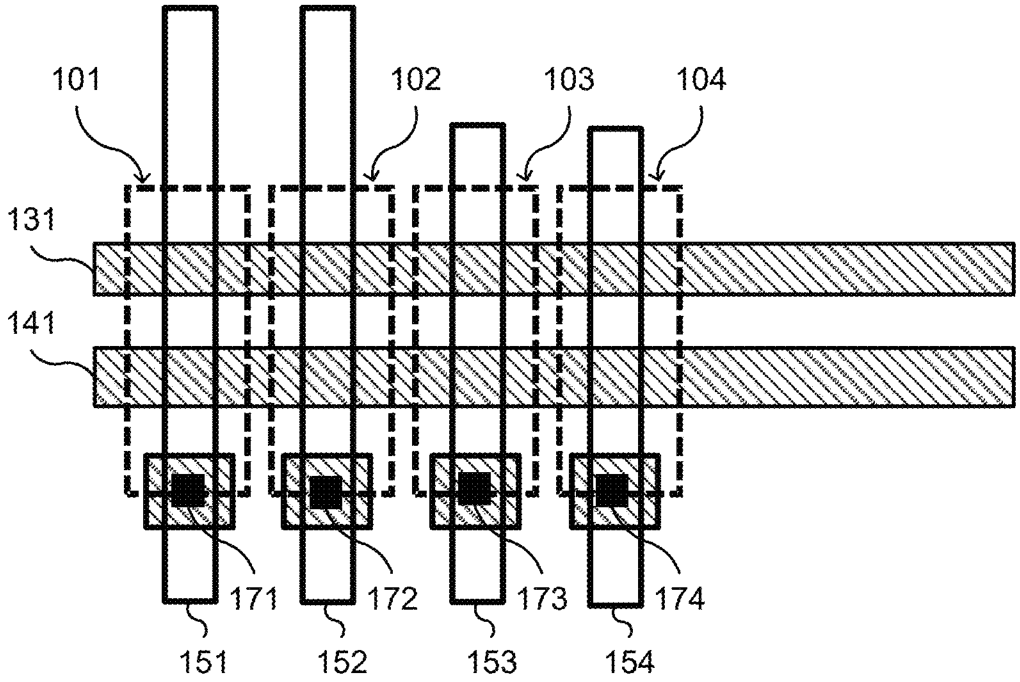
FIG. 1B show the Metal1, Via1 and Metal2 for the bitcell in FIG. 1A.

FIG. 1B shows a layout view having of four bits (the schematic in FIG. 1A shows one bit), where FIG. 1B shows the Metal1, Via1 and Metal2 for a linear array of four bitcells 101, 102, 103, and 104. As shown in FIG. 1B, the write line WL 131 and the select line 141 are formed in the gate layer (e.g., polysilicon (Poly) or metal) (not shown, running under metal1 lines 131 and 141) that is connected to Metal1 layer (shown with diagonal line pattern), and the write line WL 131 runs perpendicular to the bitlines BL 151, 152, 153, and 154, with the bitlines formed in the Metal2 layer and connecting to the Metal1 layer through contacts having the shape of dots or islands 171, 172, 173, and 174. Because both write line WL 131 and the bitlines BL 151, 152, 153, and 154 need to carry high current during programing, ideally, they should both be in the backside metal when the backside metal is designed for low resistance (e.g., with a larger cross-sectional area).

However, as noted above, it is difficult to form small dots 171, 172, 173, and 174 in backside metal using patterning techniques such as diffraction. The bitlines BL 151, 152, 153, and 154 are also used in the high-speed, low current read operation, and therefore they should be in the topside metal, which has thinner wires with lower capacitance. Therefore, such a bitcell design 100 shown in FIG. 1A is not well suited for processes with low capacitance metal interconnect (e.g., transmitting high frequency signals) separated from low resistance metal interconnect (e.g., delivering power) in top and bottom metallization (e.g., high speed, low capacitance metal interconnect in the top metallization and high current, low resistance metal interconnect in the bottom metallization, or vice versa).

In another bitcell design (not shown), the metal used to route the bitlines and wordlines can be flipped. However, this change merely moves the locations of the metal islands to different locations and does not solve the underlying problem where these metal islands consume a large amount of area (space in the integrated circuit design).

Generally, the read time for OTP bitcells is much faster than the write time. The read operation is also typically performed at a much lower current. Other OTP non-volatile memory (NVM) designs may use the same metal interconnect to read from and write to the bitcell. However, in semiconductor technologies that have two types of metal interconnect optimized for different purposes (e.g., different current and speed), there is an opportunity for improvement.

As such, aspects embodiments of the present disclosure relate to one-time programmable (OTP) bitcells that use different metal interconnects for programming versus reading an OTP bitcell. For example, the signals to write the bitcell may be applied through the high current, low resistance backside metal interconnect and the signals to read the bitcell should be applied and received through the high speed, low capacitance topside metal interconnect.

Technical advantages of the present disclosure include but are not limited to the separation of high speed, low capacitance read metal interconnects from high current, low resistance metal interconnects (e.g., front side or topside signal metal lines separated from buried or backside power metal lines). This separation changes the design constraints for a bitcell layout for devices such as fuses and anti-fuses, as it is desirable for these bitcells to have: small size (area), a first operation that requires high current (e.g., in order to rupture a gate oxide in the anti-fuse to form a permanent low-resistance link), and a second operation that requires high speed (e.g., high frequency to perform high speed reads of the stored data). Aspects of embodiments of the present disclosure include a one-time programmable (OTP) bitcell designed to use the present interconnect schemes with separate topside metal interconnect and backside metal interconnect.

Some aspects of embodiments relate to OTP bitcells that include an additional device, or devices, so the high current, low resistance lines can run parallel and be switched by a device with a control signal running perpendicular to the high current, low resistance lines. This provides a technical advantage in that it avoids the need to have two high current signals running perpendicular to each other, as in the case of other OTP bitcells.

Figure 2:
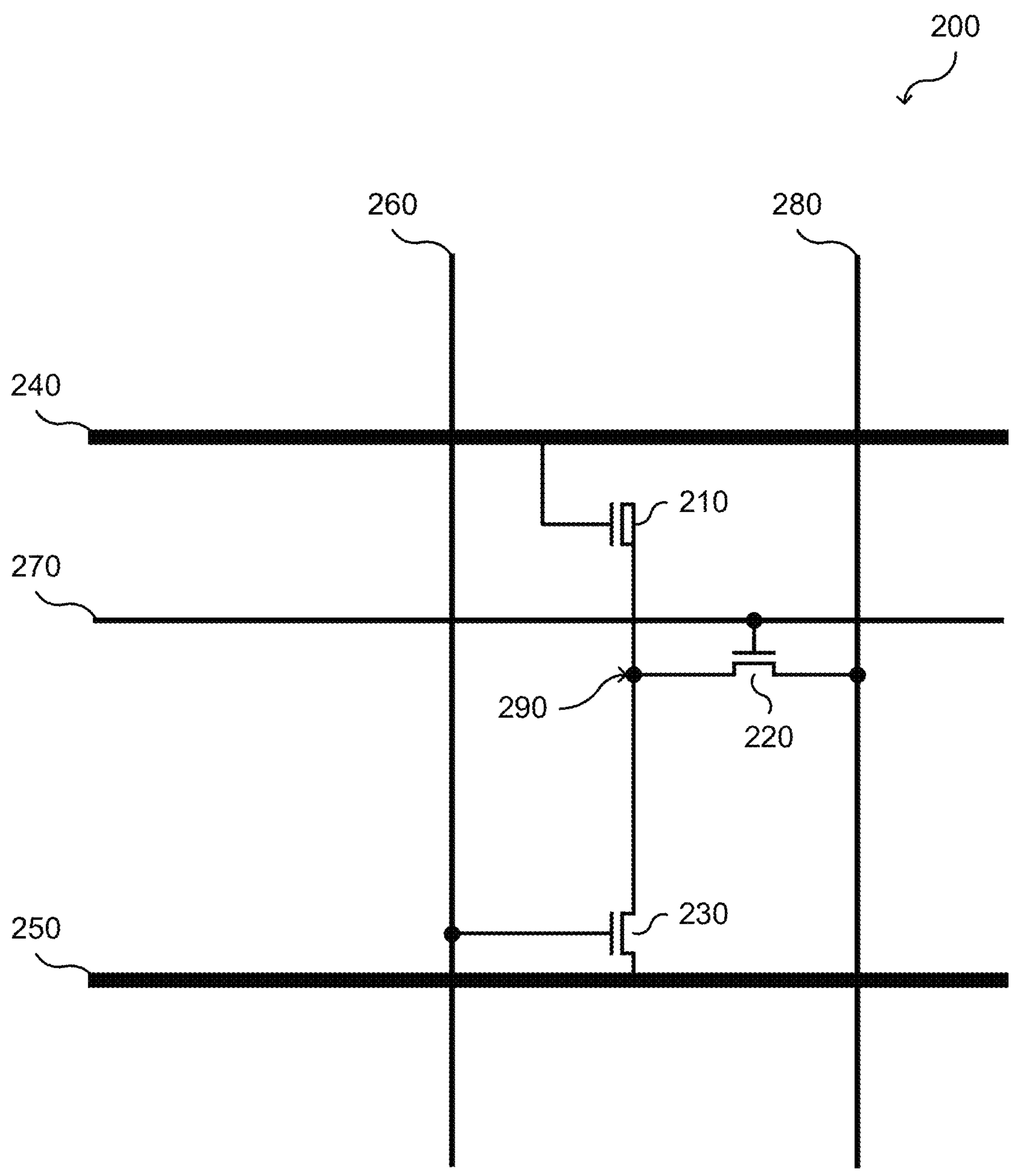
FIG. 2 is a circuit diagram of a three transistor (3T) one-time programmable (OTP) bitcell with an anti-fuse device, a select read device, and a select write device according to one embodiment of the present disclosure.

FIG. 2 is a circuit diagram of a three transistor (3T) one-time programmable (OTP) bitcell 200 with an anti-fuse device 210, a select read device 220, and a select write device 230 according to one embodiment of the present disclosure. In the example of FIG. 2, the write-once programmable circuit element is an anti-fuse device 210 that is shown as an NMOS device, but embodiments are not limited thereto. Having an additional transistor (in comparison to the 2T bitcell shown in FIG. 1A) allows for separate read and write (programming) paths. The bitcell shown in FIG. 2 has two high power metal lines, a first power rail 240 (or fuse power rail or supply power rail or word line WL) and a second power rail 250 (or VSS or ground power rail), running in parallel in backside or buried metal lines metal (as indicated by the thicker lines in FIG. 2). As used herein, the term parallel includes lines that are exactly parallel as well as lines that are substantially parallel (e.g., non-crossing or non-intersecting in a plan view of the integrated circuit layout). As used herein, the term perpendicular refers to lines that cross or intersect within the layout of the bitcell or array of bitcells (while this will generally be at 90 degrees, the present disclosure is not limited thereto, and these perpendicular or otherwise crossing lines may cross at angles near 90 degrees or other angles such as 45 degrees or 60 degrees). The select read device 220 is in series with the anti-fuse device 210 between the two high power metal lines 240 and 250. The select write device 230 is controlled by a write signal supplied to its gate through a write select line 260 in top metal (as indicated by the thinner lines) that runs perpendicular to the buried or backside metal lines 240 and 250. During programming, the write select line 260 can turn on the select write device 230 inside the OTP bitcell 200, allowing for high current to flow a very short distance through topside metal from the first power rail 240 (or fuse power rail or supply power rail) through the anti-fuse device 210 to the VSS rail 250 (or ground power rail). The select write device 230 can be made large enough to handle the current needed. A read select line 270 in the topside metal (in another embodiment, not shown, line 270 is run in a gate layer (e.g., polysilicon or metal)) is used to control a gate of the select read device 220 to read the OTP bitcell 200 using a high speed, low current path through the bitline (BL) 280, where the select read device 220 is connected between the bitline 280 and a middle node 290 between the anti-fuse device 210 and the select write device 230.

Figure 3A:
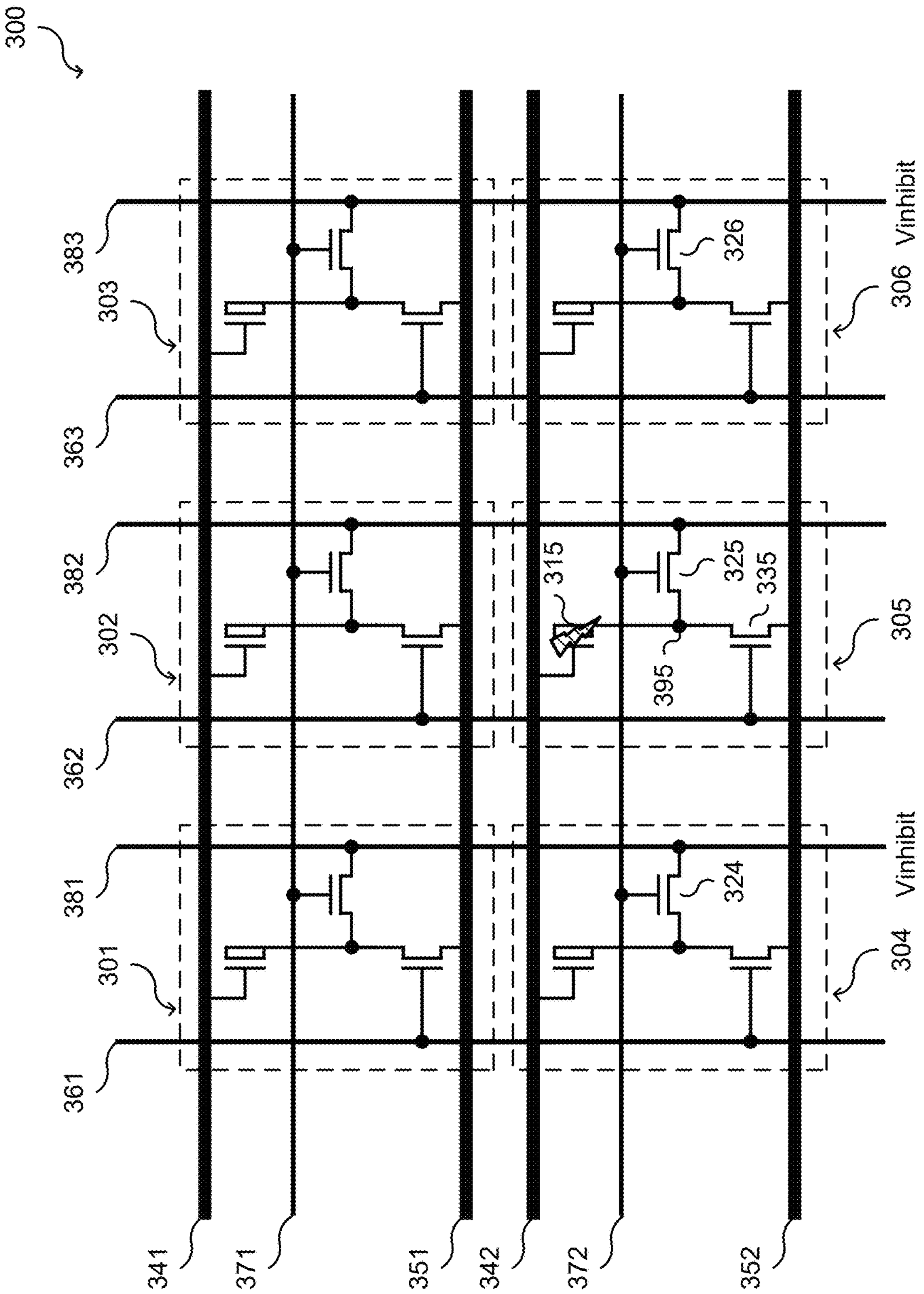
FIG. 3A shows an example embodiment of a 3×2 array of 3T OTP bitcells with separate read and program paths according to the embodiment of FIG. 2.

FIG. 3A shows an example embodiment of a 3×2 array 300 of 3T OTP bitcells with separate read and program paths according to the embodiment of FIG. 2. In the example shown in FIG. 3A, a first row of three bitcells 301, 302, and 303 are all connected to a first fuse power rail 341 (or first supply power rail), a first VSS power rail 351 (or first ground power rail, and first read select line 371 extending horizontally in parallel (e.g., in the row direction). Likewise, a second row of three bitcells 304, 305, and 306 are all connected to a second fuse power rail 342 (or second supply power rail), a second VSS power rail 352 (or second ground power rail), and a second read select line 372 extending horizontally in parallel (e.g., in the row direction). A first column of the 3×2 array 300 of 3T bitcells includes a first bitcell 301 from the first row and fourth bitcell 304 from the second row, which are both connected to a first write select line 361 and a first bitline 381. Likewise, a second column includes a second bitcell 302 from the first row and a fifth bitcell 305 from the second row, both of which are connected to a second write select line 362 and a second bitline 382. A third column includes a third bitcell 303 from the first row and a sixth bitcell 306 from the second row, both being connected to a third write select line 363 and a third bitline 383.

To store a value in a 3T OTP bitcell of the array, voltage signals are applied to the power rails and the write line to select an individual bitcell whose write-once programmable circuit element (e.g., an anti-fuse or fuse) is to be ruptured in order to change the value that is output from the bitcell when its value is read. Accordingly, some aspects of the present disclosure relate to applying voltage signals in a manner that results in the programming of an individual OTP bitcell without affecting the values stored in other bitcells in the array.

Figure 3B:
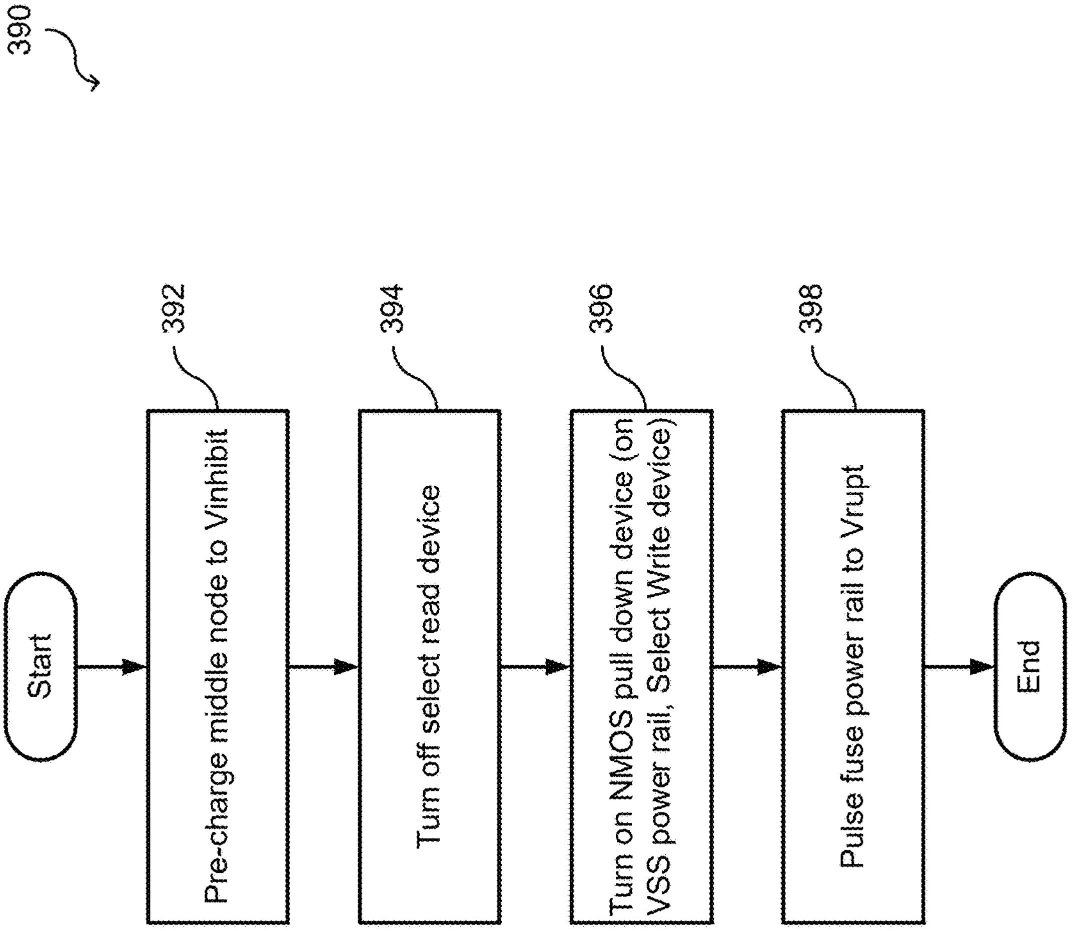
FIG. 3B shows a flowchart of a method for performing a write operation to an array of 3T OTP bitcells with separate read and program paths according to the embodiment of FIG. 3A.

In the example shown in FIG. 3A, the fifth bitcell 305 (the middle cell in the lower row) is to be programmed by rupturing its anti-fuse device 315. FIG. 3B shows a flowchart of a method 390 for performing a write operation to an array of 3T OTP bitcells with separate read and program paths according to the embodiment of FIG. 3A. The method may be performed by an OTP memory programming circuit or other controller circuit connected to control the signals (e.g., voltages) supplied to the power rails and write lines of the array 300. In some embodiments, an OTP memory programming circuit configured to implement the method described herein is integrated into a specialized OTP memory controller for the OTP memory and may be specified in a macro to be integrated into an integrated circuit or specified in register transfer level code to be integrated into other synthesized logic on an integrated circuit.

To program a 3T bitcell such as that shown in FIG. 2 and FIG. 3A, at 392, the programming circuit pre-charges the middle nodes of all the bitcells that share the power line that will later be raised to the rupture voltage, in this example the middle nodes of the fourth bitcell 304, the fifth bitcell 305 (middle node 395), and the sixth bitcell 306 connected to the second fuse power rail 342, where the middle nodes are between the anti-fuse device and the select write device 230. These middle nodes are pre-charged to an intermediate voltage (Vinhibit greater than 0V and less than the rupture voltage) in order to protect anti-fuse devices of other bitcells in the row from rupturing due to leakage. In more detail and referring to the example of FIG. 3A where the fifth bitcell 305 in the second row is being ruptured, at 392, the programming circuit applies a voltage signal to second read select line 372 to turn on its connected read select devices 324, 325, and 326, and applies the Vinhibit voltage to at least all of the bitlines other than the bitline connected to the bitcell that will be ruptured—in this example, at least the first bitline 381 and the third bitline 383. This sets the voltages of the middle nodes of the fourth bitcell 304 and the sixth bitcell 306 to Vinhibit.

At 394, the programming circuit turns off the select read devices 324, 325, and 326 connected to the second read select line 372, such as by disabling the signal applied to the second read select line 372 (e.g., corresponding to read select device 220 as shown in FIG. 2), such as by applying a voltage below the threshold voltage that would turn on the select read devices 324, 325, and 326.

At 396, the programming circuit turns on the select write device 335 connected to the fifth bitcell 305 (the bitcell whose anti-fuse is to be ruptured) by applying a voltage signal to the corresponding second write select line 362. All other select write devices are kept off (e.g., by applying voltages to the gates of the select write devices through the first write select line 361 and the third write select line 363 in FIG. 3A to turn off the corresponding select write devices).

At 398, the programming circuit pulses the second fuse power rail 342 to a voltage sufficient to rupture the anti-fuse (Vrupt). The particular voltage depends on the semiconductor process technology and electrical characteristics of the anti-fuse. In some examples, this voltage level is 4V and is typically higher than VDD (e.g., in some semiconductor process technologies, VDD may be 1V).

In some embodiments of the present disclosure, instead of holding the write select line 362 high and pulsing the second fuse power rail 342, the second fuse power rail 342 is held at a rupture voltage Vrupt and a pulse is supplied to the write select line 362 corresponding to the bitcell to be programmed (e.g., the fifth bitcell 305 of FIG. 3A).

In addition, in some embodiments of the present disclosure, instead of programming bitcells one at a time, multiple bitcells in a same row may be programmed simultaneously. In some examples, the write lines corresponding to the multiple cells to be programmed are all set to turn on the select write device of each bitcell, and the second fuse power rail 342 is then pulsed to permanently change the anti-fuses (or fuses) in each of the corresponding bitcells. Alternatively, the second fuse power rail 342 may be held at the rupture voltage Vrupt and the write lines corresponding to the bitcells to be programmed may be pulsed to permanently change the anti-fuse or fuse therein to program those bitcells. In some example embodiments, the number of bitcells that can be programmed simultaneously depends on the current required to rupture an anti-fuse or fuse and the maximum amount of current that can be supplied from the programming circuit through the power rails.

Figure 3C:
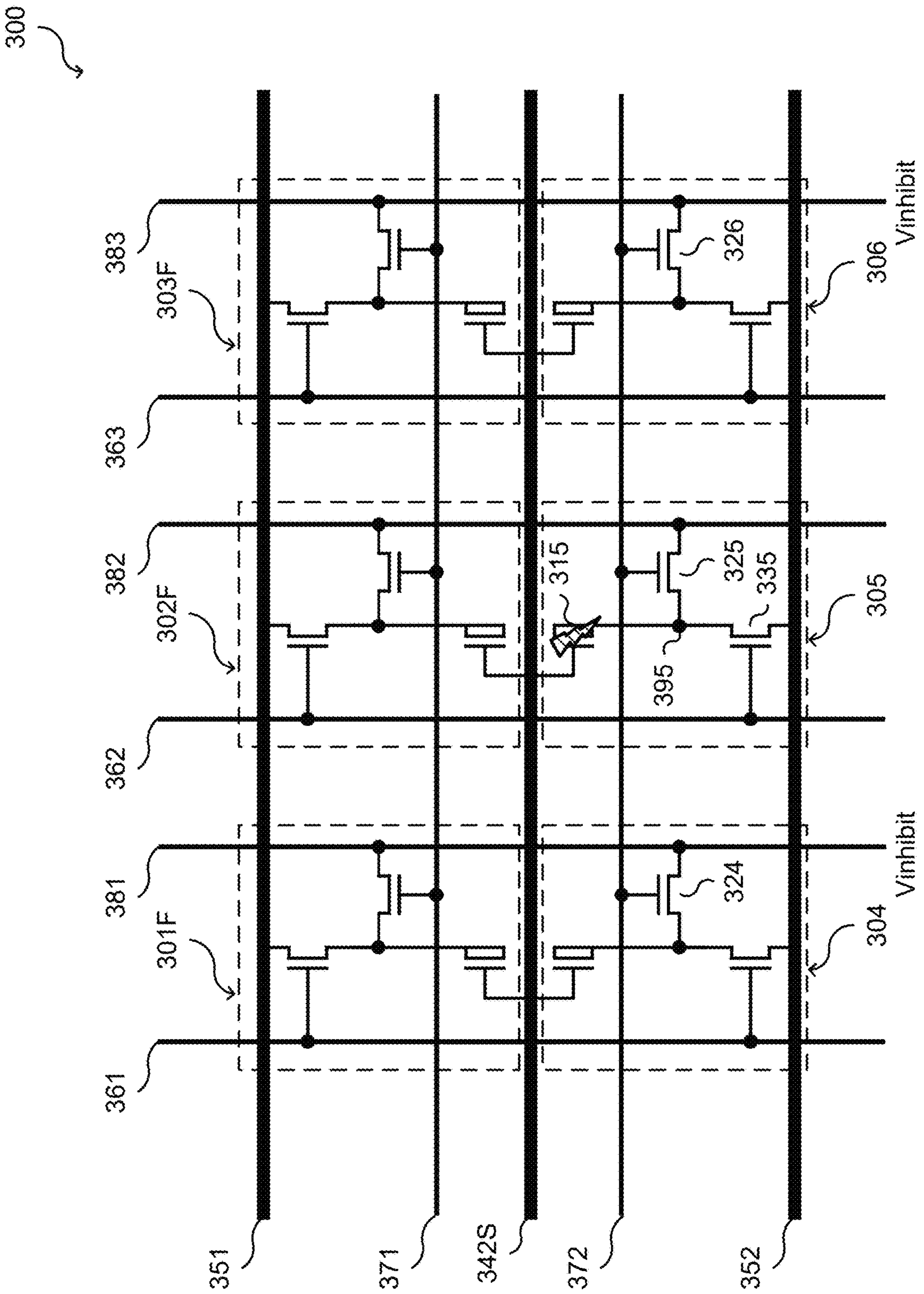
FIG. 3C shows an example embodiment of a 3×2 array of 3T OTP bitcells with separate read and program paths according to the embodiment of FIG. 2 and where adjacent rows of 3T OTP bitcells share a power rail.

FIG. 3C shows an example embodiment of a 3×2 array of 3T OTP bitcells with separate read and program paths according to the embodiment of FIG. 2 and where adjacent rows of 3T OTP bitcells share a power rail. In more detail, by having adjacent rows of bitcells share power rails, there is an area savings in the layout of the OTP memory. For example, as seen in FIG. 3A, the area between the first VSS power rail 351 and the second fuse power rail 342 may go unused and design rules may require minimum spacing between these power rails, and also requiring two power rails to be placed for each row of the array. In contrast, in the example of FIG. 3C, the first row of OTP bitcells 301F, 302F, and 303F are flipped along the row axis relative to the first row of OTP bitcells 301, 302, and 303 shown in FIG. 4A, such that the first row and the second row of OTP bitcells share a fuse power rail 342S. By continuing the flipping pattern, such a layout requires an average of one power rail per row of bitcells, plus one more power rail at the top or bottom of the array (e.g., N+1 power rails for an array of N rows), thereby resulting in savings in both area and number of power rails required.

In the arrangement shown in FIG. 2 and in FIG. 3A, the select write device 230 of FIG. 2 or the select write device 335 of FIG. 3A should be large enough to pass the current needed to rupture the anti-fuse device 210 of FIG. 2 or the anti-fuse device 315 of FIG. 3A. For example, to rupture the gate oxide of the anti-fuse to form a permanent, low resistance connection, this current may be about 150-250 μA, depending on the sizes of the features of the anti-fuse and based on the semiconductor process technology.

Table 1 shows the operation of the bitcell shown in FIG. 2, according to one embodiment.

TABLE 1

| | Read Selected | Read Unselected | Rupture Selected | Rupture Unselected |
|---|---|---|---|---|
| Write Select Gate | 0 V | 0 V | VDD | 0 V |
| Read Select Gate | VDD | 0 V | Pre-Charge Vinhibit + VTN then 0 V | 0 V |
| bitline (BL) | Pre-Charge 0 V | Pre-Charge 0 V | Pre-Charge Vinhibit then 0 V | Pre-Charge Vinhibit then 0 V |
| Fuse Power Rail (word line WL) | VDD or higher | 0 V | Vrupt | 0 V |
| VSS Power Rail | 0 V | 0 V | 0 V | 0 V |

While the OTP bitcell 200 shown in FIG. 2 and the bitcells shown in the array 300 of FIG. 3A include write-once programmable circuit elements implemented using anti-fuses, embodiments are not limited thereto. For example, in some embodiments, the bitcell is implemented with a fuse device as the write-once programmable circuit element instead of an anti-fuse (e.g., such that the fuse, by default, provides a low resistance connection but ruptures when high current is applied to the fuse, thereby breaking the low resistance connection).

Figure 4A:
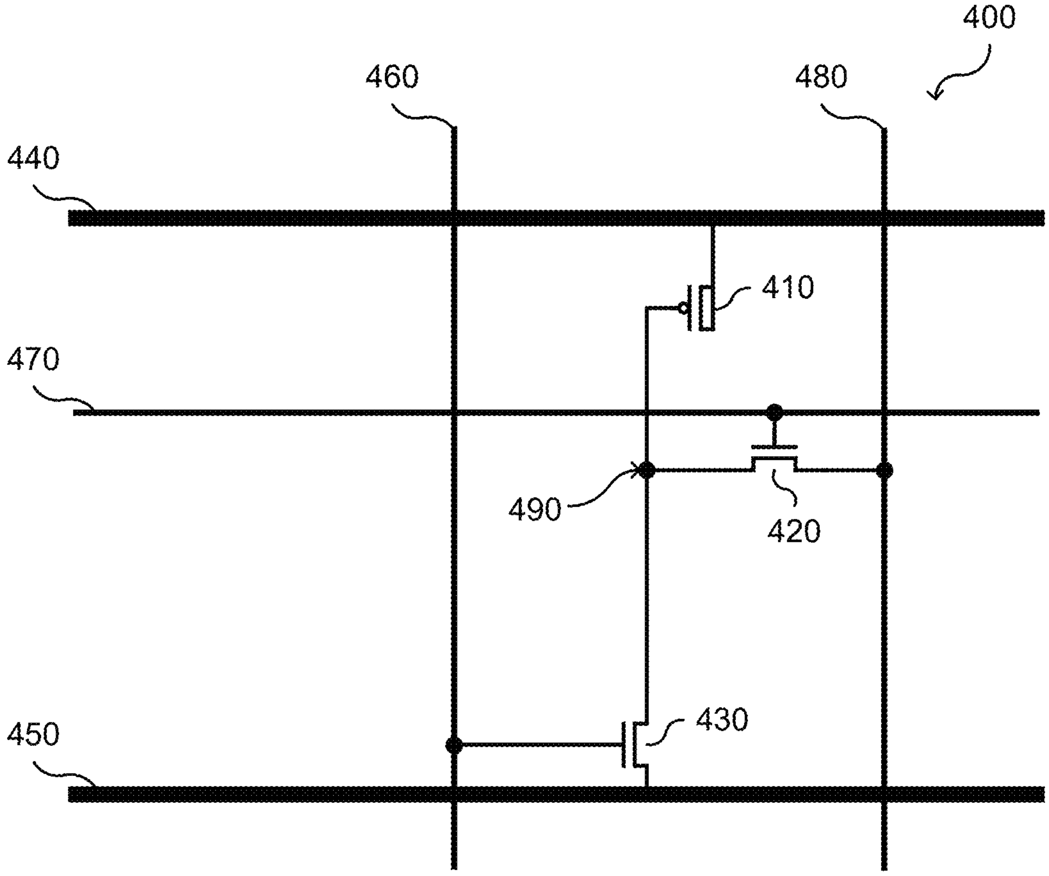
FIG. 4A shows an embodiment of the bitcell of FIG. 2 with a positive metal oxide semiconductor (PMOS) or negative metal oxide semiconductor (NMOS) anti-fuse where the source or drain of the anti-fuse is connected to the fuse power rail.

In the embodiment shown in FIG. 2, the gate electrode of the NMOS anti-fuse device 210 is connected to the fuse power rail 240. However, embodiments are not limited thereto. FIG. 4A shows an OTP bitcell 400 according to an embodiment of the present disclosure, where the OTP bitcell 400 is similar to the OTP bitcell 200 of FIG. 2, but where the anti-fuse is implemented using a PMOS anti-fuse 410 (instead of an NMOS anti-fuse device 210, as shown in FIG. 2). Similarly, in the example bitcells of the embodiments shown in FIGS. 4B and 4C, discussed below, the anti-fuse has been changed from NMOS to PMOS.

The source or drain of the anti-fuse 410 of the OTP bitcell 400 is connected to a fuse power rail 440. A gate electrode of the PMOS anti-fuse 410 is connected to a select write device 430 (e.g., an NMOS write select device 430) through a middle node 490, where the anti-fuse 410 and the select write device 430 are connected in series between the fuse power rail 440 and a ground power rail 450. The select write device 430 is controlled by signals applied to the gate electrode of the select write device 430, as supplied through a write select line 460 extending in the column direction. A select read device 420 is connected between the middle node 490 and a bitline 480 and is controlled by a read select line 470 connected to the gate electrode of the select read device 420.

Selecting an NMOS versus a PMOS anti-fuse may have different design tradeoffs. For example, for device reasons and depending on various design factors outside of the bitcell, it may be easier to rupture or to read an NMOS anti-fuse versus a PMOS anti-fuse (or vice versa), or selecting one type of anti-fuse versus the other may reduce the size of the bitcell. For example, in some processes the N-type and P-type transistors are stacked on different levels. In some embodiments, stacking devices one on top of each other using a mix of NMOS and PMOS reduces the size of the bitcell (e.g., where the PMOS anti-fuse 410 may be stacked on an NMOS write select device 430).

When rupturing the anti-fuse of a bitcell during programming, high voltages may be applied to the transistors of other bitcells connected to the same fuse power rail or word line WL (e.g., in the same row as the bitcell being programmed). For example, as shown in FIG. 3A, the anti-fuse of the fifth bitcell 305 is ruptured by applying 0 V or Vinhibit during a pre-charge phase, then applying the rupture voltage Vrupt to the second fuse power rail 342 (or word line WL). Similarly, as shown in FIG. 4A, the anti-fuse 410 of the OTP bitcell 400 is ruptured by applying 0 V or Vinhibit during a pre-charge phase, then applying the rupture voltage Vrupt to the fuse power rail 440 (or word line WL).

Figure 4B:
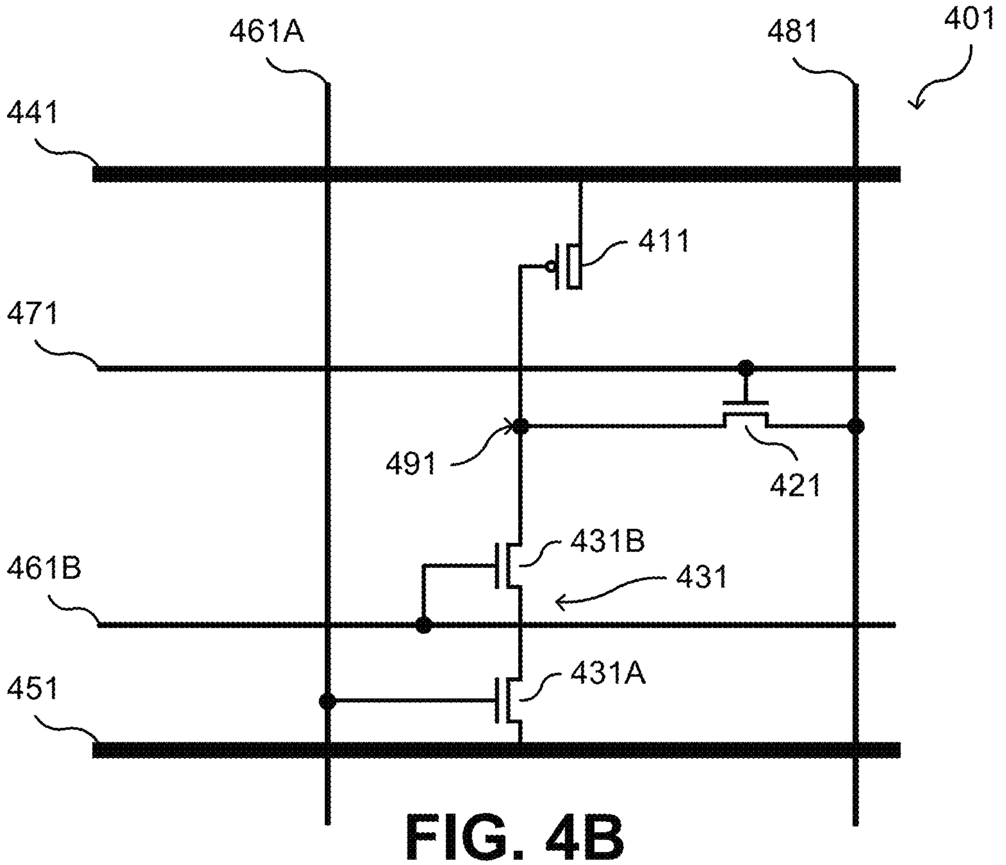
FIGS. 4B and 4C shows additional embodiments of the bitcell with additional devices added to reduce stress on the transistors during programming.
Figure 4C:
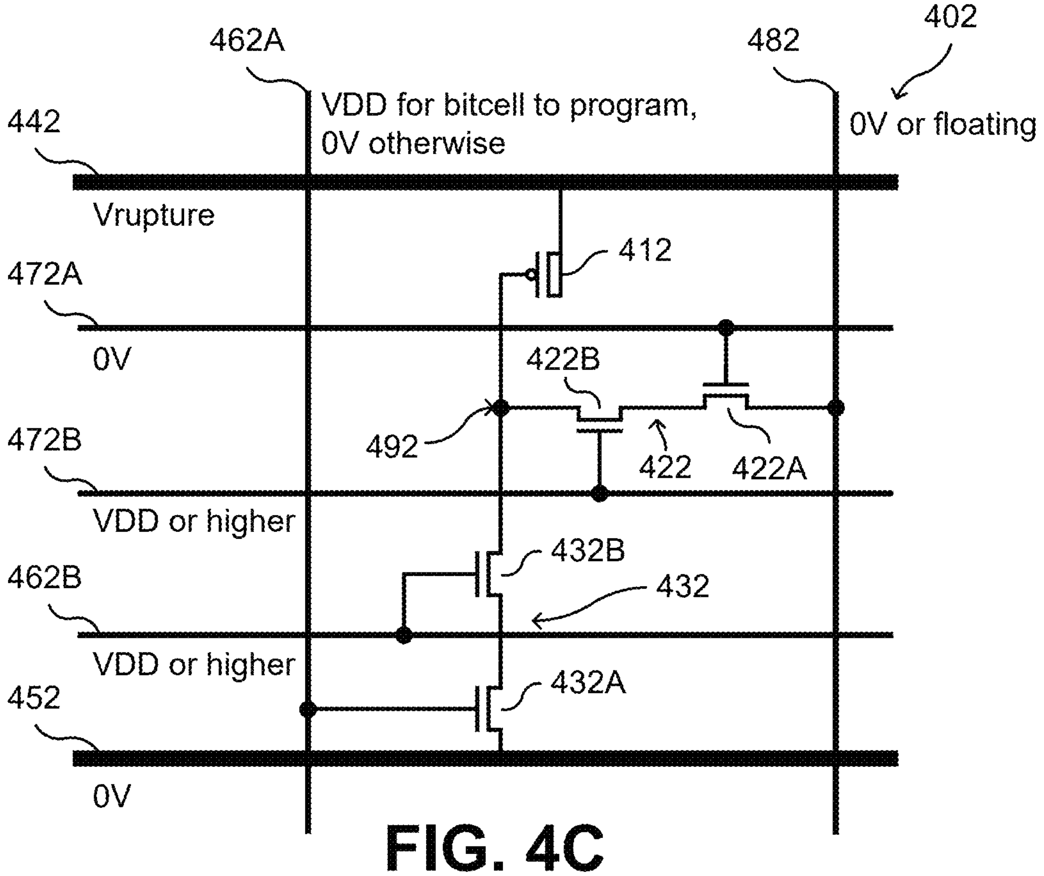

FIGS. 4B and 4C shows additional embodiments of the bitcell with additional devices added to reduce stress on the transistors during programming. For example, an NMOS cascode device may be added to reduce gate induced drain leakage (GIDL) during write or rupture of a write-once programmable circuit element (e.g., an anti-fuse device) 411. The additional NMOS device may be shorted to VDD or switched, and the gate connection may be routed vertically or horizontally. In the OTP bitcell 401 shown in FIG. 4B, the NMOS cascode transistor 431B is added to the select write device 431, such that the select write device 431 includes two NMOS transistors 431A and 431B in series, where the first NMOS transistor 431A of the select write device has a gate electrode connected to a first write select line 461A extending in a direction parallel to a bitline 481 and the second NMOS transistor 431B of the select write device 431 has a gate electrode connected to a second write select line 461B extending in a direction crossing the first write select line 461A (e.g., parallel to a read select line 471, a fuse power rail 441, and a ground power rail 451). In the arrangement shown in FIG. 4B, the select read device 421 is unmodified from the example shown in FIG. 4A and is connected between middle node 491 and the bitline 481.

Similarly, in the OTP bitcell 402 shown in FIG. 4C, NMOS cascode devices are added to both the select read device 422 and the select write device 432, such that the select read device 422 includes a first NMOS transistor 422A and a second NMOS transistor 422B in series between a middle node 492 and a bitline 482 and the select write device 432 includes a first NMOS transistor 432A and a second NMOS transistor 432B in series between the middle node 492 and a ground power rail 452. An anti-fuse device 412 and the select write device 432 are connected in series between a fuse power rail 442 and the ground power rail 452, with the middle node 492 located between the anti-fuse device 412 and the select write device 432. The first NMOS transistor 422A and the second NMOS transistor 422B of the select read device 422 have gate electrodes that are respectively connected to a first read select line 472A and a second read select line 472B, both extending in a direction parallel to the fuse power rail 442 and the ground power rail 452.

FIG. 4C is further labeled with voltages applied to the signal lines of an OTP bitcell 402 in a row of OTP bitcells during programming. By setting the gate electrodes of the cascode devices closer to the middle node 492 (the second NMOS transistor 422B of the select read device 422 and the second NMOS transistor 432B of the select write device 432) to turn on the NMOS transistors, during programming, the stress on the other, turned off members of the cascode devices (respectively, the first NMOS transistor 422A of the select read device 422 and the first NMOS transistor 432A of the select write device 432) is reduced. Accordingly, in the embodiment shown in FIG. 4C, the first write select line 462A is set to VDD or higher for the column corresponding to the bitcell that is to be programmed and set to 0V for the other columns. The second write line 462B is set to VDD or higher, which turns on the cascode second NMOS transistor 432B of the select write device 432, thereby allowing current to flow through the select write device 432 of the OTP bitcell that is to be programmed, while also providing voltage protection to the second NMOS transistor 432B of the other OTP bitcells in the same row. Likewise, the cascode second NMOS transistor 422B of the select read device 422 is turned on by applying VDD or higher through the second read select line 472B, which provides voltage protection to the first NMOS transistor 422A of the select read device 422. (In the example shown here, the bitline 482 may be set to 0V or may be unset (floating).) Accordingly, when the rupture voltage Vrupt is applied (e.g., pulsed) on the fuse power rail 442, the cascode NMOS transistors of the select read device 422 and the select write device 432 provide voltage protection.

Figure 5A:
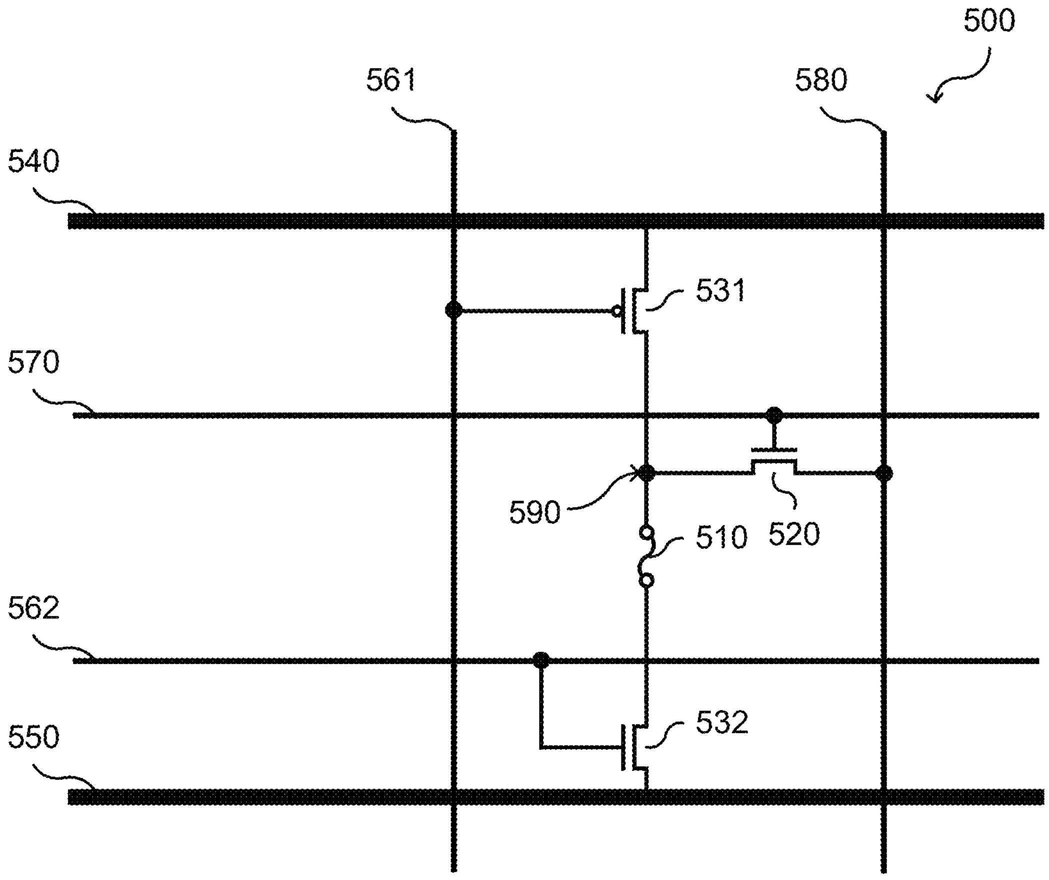
FIG. 5A is a circuit diagram of a bitcell with a fuse according to one embodiment of the present disclosure.

As discussed above, while an OTP bitcell according to some embodiments include an anti-fuse as the write-once programmable circuit element, embodiments are not limited thereto. For example, some embodiments of the present disclosure are directed to OTP bitcells that include a fuse as the write-once programmable circuit element instead of an anti-fuse. FIG. 5A is a circuit diagram of a bitcell 500 with a fuse 510 according to one embodiment of the present disclosure. As shown in FIG. 5A, a PMOS write device 531 (e.g., PMOS transistor or first select write device), the fuse 510, and an NMOS write device 532 (e.g., NMOS transistor) are connected in series between a pair of power rails (e.g., a fuse power rail 540 supplying a high voltage VDD and a ground power rail 550 supplying a low voltage VSS). The gate of the PMOS transistor or PMOS write device 531 is connected to a first control line 561 that is perpendicular to a second control line 562 connected to the gate of the NMOS transistor or NMOS write device 532 or second select write device.

In the embodiment shown in FIG. 5A, the first control line 561 is parallel to a bitline 580 and the second control line 562 is parallel to the power rails 540 and 550. A select read device 520 (e.g., an NMOS transistor) is connected between the bitline 580 and a middle node 590, where the middle node is between the fuse 510 and the PMOS write device 531, where a gate electrode of the select read device 520 is connected to a word line or read select line 570. In the bitcell 500 of FIG. 5A, the power rails 540 and 550 can be held at a fixed voltage (directly connected to VDD and VSS). A single bitcell 500 is programed by selectively turning on the gates of both select write devices (the PMOS select write device 531 and the NMOS select write device 532) that are controlled with gate signals that run perpendicular to each other (e.g., one gate signal parallel to the bitline BL and perpendicular to the power rails, and another gate signal perpendicular to the bitline and parallel to the power rails).

When using a fuse, a very large current is used to permanently change the device characteristics. However, there is a possibility that the device characteristics of the fuse 510 will be shifted if high current flows through the fuse 510 during read operations. Therefore, in some embodiments, the select read device 520 much smaller (e.g., the transistor is narrower) than the select write devices (the PMOS select write device 531 and the NMOS select write device 532), which thereby limits or restricts the current during read operations. In some embodiments, the current is restricted by using lower voltages on the gate of the select read device 520. In some embodiments, a controller accessing the data stored in the OTP bitcells ensures that the read operation is performed very quickly so that the current flowing through the fuse 510 during the read operation is a very short pulse. Some embodiments of the present disclosure implement combinations of the above techniques, in some cases with other techniques, to limit or restrict the current flowing through the fuse 510 during read operations.

Table 2 shows the operation of the bitcell in FIG. 5A according to one example of the present disclosure.

TABLE 2

| | Read Selected | Read Unselected | Rupture Selected | Rupture Unselected |
|---|---|---|---|---|
| PMOS Write Select Gate | VDD | VDD | 0 V | ≥VDD |
| NMOS Write Select Gate | VDD | 0 V | VDD | 0 V |
| Select | VDD | 0 V | 0 V | 0 V |
| bitline (BL) | Pre-Charge VDD | Pre-Charge VDD | X | X |
| Power Rail PMOS | VDD | VDD | >=VDD | VDD |
| Power Rail NMOS (VSS) | 0 V | 0 V | 0 V | 0 V |

Figure 5B:
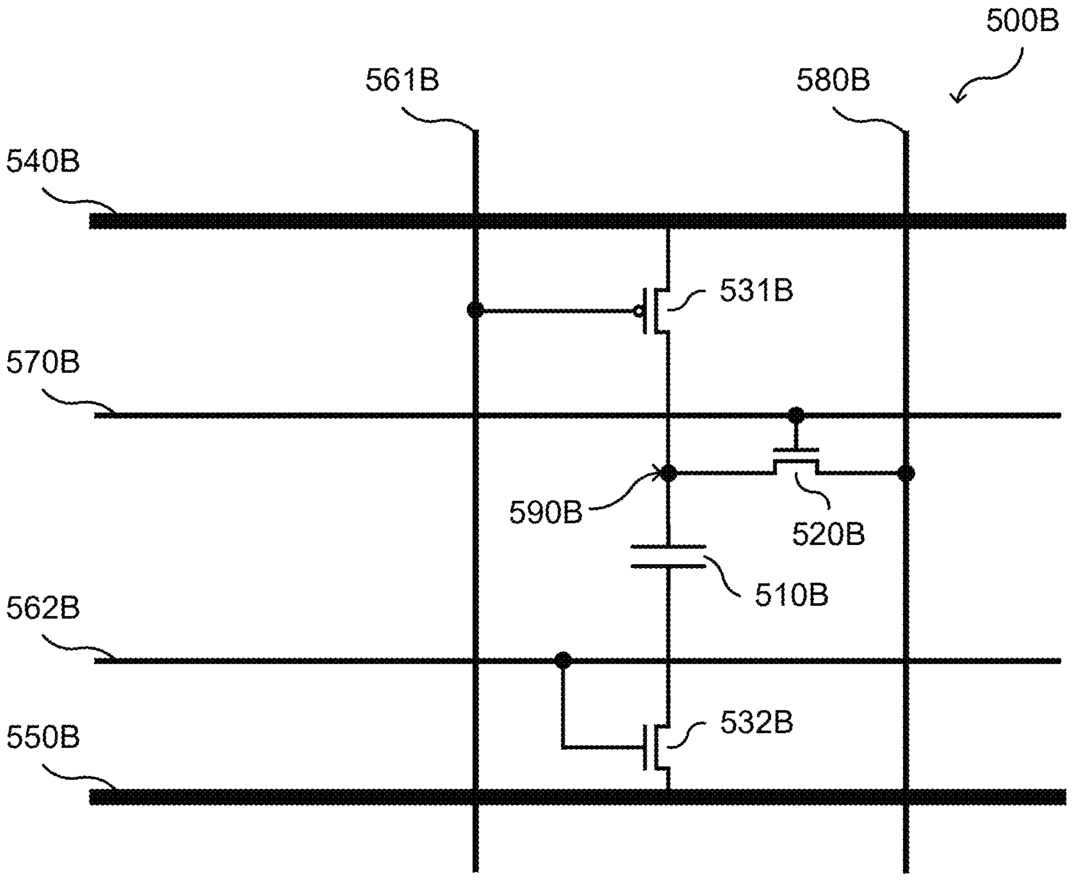
FIG. 5B is a circuit diagram of a bitcell with an anti-fuse implemented using a capacitor according to one embodiment of the present disclosure.

FIG. 5B is a circuit diagram of a bitcell 500B with an anti-fuse implemented using a capacitor according to one embodiment of the present disclosure. As shown in FIG. 5B, a PMOS write device 531B (e.g., PMOS transistor or first select write device), a write-once programmable circuit element 510 is an anti-fuse shown as a capacitor, and an NMOS write device 532B (e.g., NMOS transistor) are connected in series between a pair of power rails (e.g., a fuse power rail 540B supplying a high voltage VDD and a ground power rail 550B supplying a low voltage VSS). The gate of the PMOS transistor or PMOS write device 531B is connected to a first control line 561B that is perpendicular to a second control line 562B connected to the gate of the NMOS transistor or NMOS write device 532B or second select write device. The bitcell 500B shown in FIG. 5B is substantially similar to the bitcell 500 shown in FIG. 5A with the fuse 510 replaced with an anti-fuse 510B which may be implemented as a capacitor. The capacitance of the capacitor 510B may be designed such that, under read voltages the capacitor 510B acts as an open circuit. However, when a rupture voltage is applied across the capacitor 510B, the capacitor ruptures such that a conductive path is formed through the capacitor 510B. Accordingly, the capacitor 510B shown in FIG. 5B may serve as an anti-fuse implementation of a write-once programable circuit element.

Figure 6A:
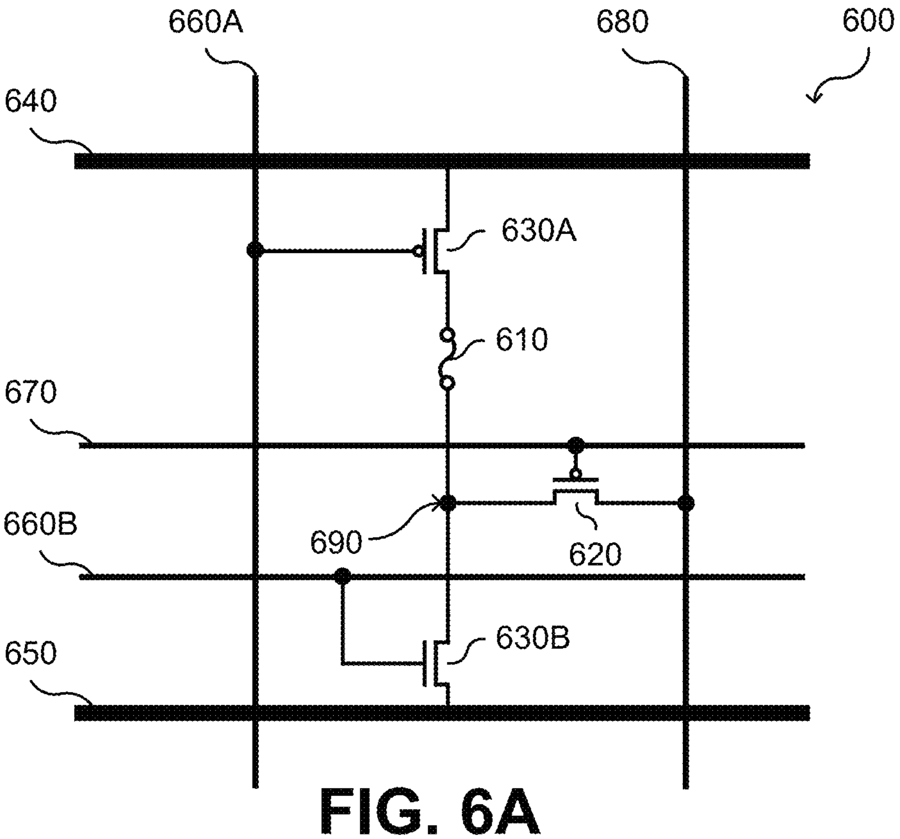
FIGS. 6A and 6B are circuit diagrams of different bitcell designs with a fuse according to one embodiment of the present disclosure.
Figure 6B:
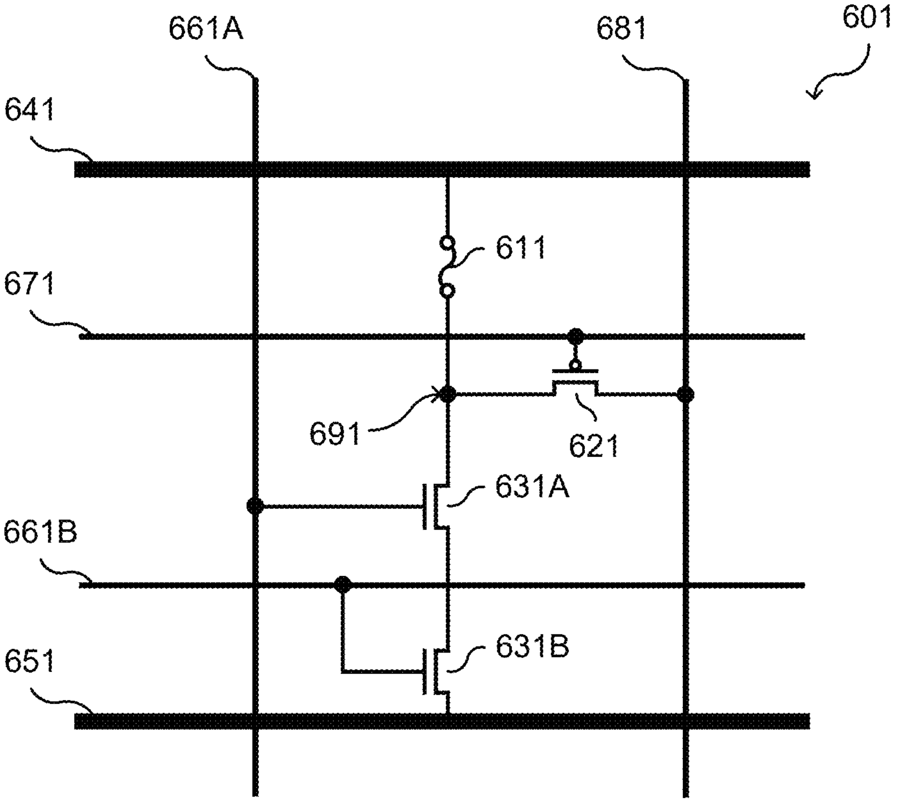

FIGS. 6A and 6B are circuit diagrams of different bitcell designs with a fuse according to one embodiment of the present disclosure. The bitcell 600 in the embodiment shown in FIG. 6A is similar to the bitcell 500 shown in FIG. 5, except that the select read device 620 is connected to a middle node 690 between a PMOS select write device 630A and the fuse 610 (instead of a node between the fuse 510 and the NMOS select write device 532, as shown in FIG. 5). Otherwise, the supply power rail 640, the ground power rail 650, bitline 680, first write select line 660A, second write select line 660B, and second select write device 630B operate much the same as corresponding components in the example of FIG. 5. In addition, the embodiment shown in FIG. 6A uses a PMOS read select device 620 (controlled by a read select line 670) instead of an NMOS read select device, as shown in FIG. 5. In any of the embodiments described above (e.g., as shown in FIGS. 2, 3A, 4A, 4B, 4C, and 5), the read select device may similarly be implemented with a PMOS read select device (e.g., a PMOS transistor) in place of the NMOS transistors illustrated therein, which appropriate corresponding changes in the voltages supplied to the control lines or read select lines connected to the gate electrodes of the read select devices. Likewise, the read select device 620 shown in FIG. 6A may be implemented using a PMOS transistor (as shown in FIG. 6A) or using an NMOS transistor.

The embodiment of the present disclosure shown in FIG. 6B, depicts an OTP bitcell 601 where the two select write devices 631A and 631B are NMOS select write devices, in a manner similar to the cascaded devices shown in FIG. 4B, but with a fuse instead of an anti-fuse. In the embodiment shown in FIG. 6A, a fuse 611, a first NMOS select write device 631A, and a second NMOS select write device 631B are connected in series between two power rails (a high voltage power rail 641 supplying a first voltage such as VDD and a low voltage power rail 651 suppling a second voltage lower than the first voltage, such as VSS), where the first NMOS select write device 631A is controlled by a first write select line 661A and the second NMOS select write device 631B is controlled by a second write select line 661B, and a select read device 621 (e.g., a PMOS select device), controlled by a read select line 671, is connected between a bitline 681 and a node 691, where the node is between the fuse 611 and the first NMOS select write device 631A. In a manner similar to that described above with respect to FIG. 4C, embodiments of the present disclosure that include a fuse instead of an anti-fuse may include multiple transistors in the select read device 621 (e.g., with two NMOS transistors connected in a cascode arrangement).

Accordingly, various aspects of embodiments of the present disclosure relate to one-time programmable (OTP) bitcells. In more detail, some aspects of embodiments relate to OTP bitcells that include additional devices so that high current, low resistance lines can run in parallel and be switched by the additional device using a control signal supplied on a control line running perpendicular to the high current, low resistance lines. Additional transistors may be further included in the bitcells to provide protection from high voltages that are applied during programming of the OTP bitcell, such as rupturing an anti-fuse (to form a permanent conductive path) or rupturing a fuse (to break a conductive path).

A computer-readable design of a one-time programmable bitcell circuit according to the present disclosure may be included within a library of available pre-designed cells or circuit blocks or circuit portions stored on a computer-readable medium (e.g., in a digital representation of a one-time programmable bitcell circuit circuit). This allows the design of a one-time programmable bitcell circuit according to the present disclosure to be placed as a standard circuit cell within a design of an integrated circuit (e.g., a digital representation of the integrated circuit). For example, a one-time programmable bitcell circuit specified by the computer-readable design may be incorporated into the design of a digital or mixed-signal integrated circuit, such that the one-time programmable bitcell circuit can store data associated with a particular instance of the integrated circuit (e.g., in the form of a programmed serial number, identifier, encryption key, or the like).

Specifications for a circuit or electronic structure (which may also be referred to as "instructions, which when executed by a processor, cause the processor to generate a digital representation of the circuit or electronic structure") may range from low-level transistor material layouts to netlists to high-level description languages such as Verilog or VHDL.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An one-time programmable memory comprising:

a select read device connected between a node and a first bitline, the select read device having a gate electrode connected to a first signal line extending substantially perpendicular to the first bitline;

a first select write device connected between a supply power rail and a power rail and in series with the node, the first select write device having a gate electrode connected to a second signal line extending substantially parallel to the first bitline, wherein the supply power rail has higher voltage than the power rail;

a second select write device connected between the node and the power rail and in series with the first select write device and the node, the second select write device having a gate electrode connected to a third signal line extending substantially perpendicular to the first bitline; and a write-once programmable circuit element connected between the node and the power rail and in series with the first select write device, the second select write device, and the node.

2. The one-time programmable memory of claim 1, wherein the node and the write-once programmable circuit element are between the first select write device and the second select write device.

3. The one-time programmable memory of claim 1, wherein the node and the first select write device are between the write-once programmable circuit element and the second select write device.

4. The one-time programmable memory of claim 1, wherein the select read device comprises a positive metal oxide semiconductor (PMOS) read select device.

5. The one-time programmable memory of claim 1, further comprising a second one-time programmable bitcell comprising:

a second select read device connected between a second node and a second bitline extending substantially parallel to the first bitline, the second select read device having a gate electrode connected to the first signal line;

a third select write device connected between the supply power rail and the second node, the third select write device having a gate electrode connected to a third signal line extending substantially parallel to the first bitline;

a fourth select write device connected between the second node and the power rail, the fourth select write device having a gate electrode connected to the third signal line; and a second write-once programmable circuit element connected to the node, in series with the third select write device and the fourth select write device, between the supply power rail and the power rail.

6. The one-time programmable memory of claim 1, wherein the write-once programmable circuit element is a positive metal oxide semiconductor (PMOS) anti-fuse.

7. The one-time programmable memory of claim 1, wherein the first select write device comprises a first negative metal oxide semiconductor (NMOS) device, and wherein the second select write device comprises a second NMOS device.

8. The one-time programmable memory of claim 1, wherein the select read device comprises a cascode NMOS device comprising:

a first NMOS transistor having the gate electrode connected to the first signal line; and a second NMOS transistor connected in series with the first NMOS transistor and having a gate electrode connected to a third signal line extending substantially parallel to the first signal line.

9. The one-time programmable memory of claim 1, wherein the first bitline has lower capacitance than the second signal line, and wherein the second signal line has lower resistance than the first bitline.

10. An integrated circuit comprising a one-time programmable memory, a bitcell of the one-time programmable memory comprising:

a select read device connected between a node and a first bitline, the select read device having a gate electrode connected to a first signal line extending substantially perpendicular to the first bitline;

a first select write device connected between a supply power rail and a power rail and in series with the node, the first select write device having a gate electrode connected to a second signal line extending substantially parallel to the first bitline, wherein the supply power rail has higher voltage than the power rail;

a second select write device connected between the node and the power rail and in series with the first select write device and the node, the second select write device having a gate electrode connected to a third signal line extending substantially perpendicular to the first bitline; and a write-once programmable circuit element connected between the node and the power rail and in series with the first select write device, the second select write device, and the node.

11. The integrated circuit of claim 10, wherein the node and the write-once programmable circuit element are between the first select write device and the second select write device.

12. The integrated circuit of claim 10, wherein the node and first select write device are between the write-once programmable circuit element and the second select write device.

13. The integrated circuit of claim 10, wherein the select read device comprises a positive metal oxide semiconductor (PMOS) read select device.

14. A non-transitory computer-readable medium comprising stored instructions, which when executed by a processor, cause the processor to generate a digital representation a one-time programmable memory comprising a bitcell comprising:

a select read device connected between a node and a first bitline, the select read device having a gate electrode connected to a first signal line extending substantially perpendicular to the first bitline;

a first select write device connected between a supply power rail and a power rail and in series with the node, the first select write device having a gate electrode connected to a second signal line extending substantially parallel to the first bitline, wherein the supply power rail has higher voltage than the power rail;

a second select write device connected between the node and the power rail and in series with the first select write device and the node, the second select write device having a gate electrode connected to a third signal line extending substantially perpendicular to the first bitline; and a write-once programmable circuit element connected between the node and the power rail and in series with the first select write device, the second select write device, and the node.

15. The non-transitory computer-readable medium of claim 14, wherein the node and the write-once programmable circuit element are between the first select write device and the second select write device.

16. The non-transitory computer-readable medium of claim 14, wherein the node and the first select write device are between the write-once programmable circuit element and the second select write device.

17. The non-transitory computer-readable medium of claim 14, wherein the select read device comprises a positive metal oxide semiconductor (PMOS) read select device.

18. The non-transitory computer-readable medium of claim 14, wherein the write-once programmable circuit element is a positive metal oxide semiconductor (PMOS) anti-fuse.

19. The non-transitory computer-readable medium of claim 14, wherein the first select write device comprises a first negative metal oxide semiconductor (NMOS) device, and wherein the second select write device comprises a second NMOS device.

20. The non-transitory computer-readable medium of claim 14, wherein the select read device comprises a cascode NMOS device comprising:

a first NMOS transistor having the gate electrode connected to the first signal line; and a second NMOS transistor connected in series with the first NMOS transistor and having a gate electrode connected to a third signal line extending substantially parallel to the first signal line.

* * * * *